United States Patent [19]
DelPrete

[11] Patent Number: 6,114,757
[45] Date of Patent: Sep. 5, 2000

[54] LEADLESS IC SOCKET

[75] Inventor: Stephen D. DelPrete, Rehoboth, Mass.

[73] Assignee: Thomas & Betts International, Inc., Sparks, Nev.

[21] Appl. No.: 09/406,442

[22] Filed: Sep. 27, 1999

[51] Int. Cl.$^7$ ............... H01L 23/02; H01L 23/34
[52] U.S. Cl. ............ 257/678; 257/726; 257/727; 439/71
[58] Field of Search .................. 257/678, 726, 257/727; 439/71, 73

[56] References Cited

U.S. PATENT DOCUMENTS

| | | | |
|---|---|---|---|
| 4,099,615 | 7/1978 | Lemke et al. | 206/329 |
| 4,417,777 | 11/1983 | Bamford | 339/17 |
| 4,679,318 | 7/1987 | Bright | 79/739 |
| 4,702,706 | 10/1987 | Sadigh-Behzadi | 439/69 |
| 5,052,101 | 10/1991 | Bright et al. | 29/749 |
| 5,322,446 | 6/1994 | Cearley-Cabbiness | 439/73 |
| 5,567,177 | 10/1996 | Foerstel et al. | 439/526 |
| 5,658,153 | 8/1997 | Ikeya et al. | 439/72 |

*Primary Examiner*—David Hardy
*Assistant Examiner*—Jhihan B Clark
*Attorney, Agent, or Firm*—Weingarten, Schurgin, Gagnebin & Hayes LLP

[57] ABSTRACT

A leadless IC or other electronic circuit package socket is provided which is of simple construction providing low profile mounting of an IC package on a circuit board. The socket comprises a relative thin socket carrier having a plurality of resilient conductive columns extending between the top and bottom surfaces of the carrier and having alignment elements which are cooperative with elements on a circuit board on which the carrier is mounted to position the carrier on the circuit board such that the conductive columns are in registration and electrical contact with corresponding ones of contacts on the circuit board. An IC package or other circuit package has contacts on the bottom surface thereof in a pattern corresponding to the pattern of the resilient conductive columns of the socket carrier, and also has alignment elements cooperative with elements on the socket carrier to provide alignment of the package contacts and the conductive columns when the package is mounted on the socket carrier. A cover fits over the IC package and has snap fittings which engage cooperative openings or other elements of the circuit board to retain the IC package in electrical engagement with the circuit board via the socket carrier.

11 Claims, 5 Drawing Sheets

LEADLESS IC SOCKET

CROSS REFERENCE TO RELATED APPLICATIONS

N/A

STATEMENT REGARDING FEDERALLY SPONSORED RESEARCH OR DEVELOPMENT

BACKGROUND OF THE INVENTION

In one type of integrated circuit (IC) package known as a leadless package, contacts are arranged as a square or rectangular array of contacts each of the contacts being of spherical shape, known as a ball grid array (BGA) or of planar shape known as a land grid array (LGA). Various sockets have been devised for retaining such leadless integrated circuit packages on a circuit board. In general such sockets include a receptacle for receiving the package and maintaining the package in registration for mating of the package contacts with the contacts of the socket, and a cover or retention mechanism for maintaining the package in position in the socket. Such sockets of known construction can be mechanically complex and are often relatively thick which adds to the overall height of components installed on a circuit board. Such known sockets are also expensive to fabricate thereby adding to the overall cost of a circuit board assembly. With the continuing commercial pressure to increase the functionality of integrated circuits and circuit boards containing integrated circuits while reducing the cost of such devices, there is a need for an integrated circuit socket and particularly a leadless IC socket which is relatively simple and inexpensive to fabricate and to employ and maintain and which can provide a low profile mounting for IC packages. There is also a need for a socket which can be easily replaced or upgraded.

BRIEF SUMMARY OF THE INVENTION

In accordance with the present invention, a leadless IC or other electronic circuit package socket is provided which is of simple construction providing a low profile mounting of an IC package on a circuit board.

The socket comprises a relative thin socket carrier having a plurality of resilient conductive columns extending between the top and bottom surfaces of the carrier and having alignment elements which are cooperative with elements on a circuit board on which the carrier is mounted to position the carrier on the circuit board such that the conductive columns are in registration and electrical contact with corresponding ones of contacts on the circuit board. An IC package or other circuit package has contacts on the bottom surface thereof in a pattern corresponding to the pattern of the resilient conductive columns of the socket carrier, and also has alignment elements cooperative with elements on the socket carrier to provide alignment of the package contacts and the conductive columns when the package is mounted on the socket carrier. A cover fits over the IC package and has snap fittings which engage cooperative openings or other elements of the circuit board to retain the IC package in electrical engagement with the circuit board via the socket carrier. The socket is of relatively simple construction which requires no separate hardware for retention of the circuit package. In addition the socket provides a low profile on the associated circuit board.

In an alternative embodiment, the IC package is captured on the socket cover such that the IC package and or cover to which it is attached can be handled as a single unit for mounting onto the circuit board.

DETAILED DESCRIPTION OF THE INVENTION

Figure 1:
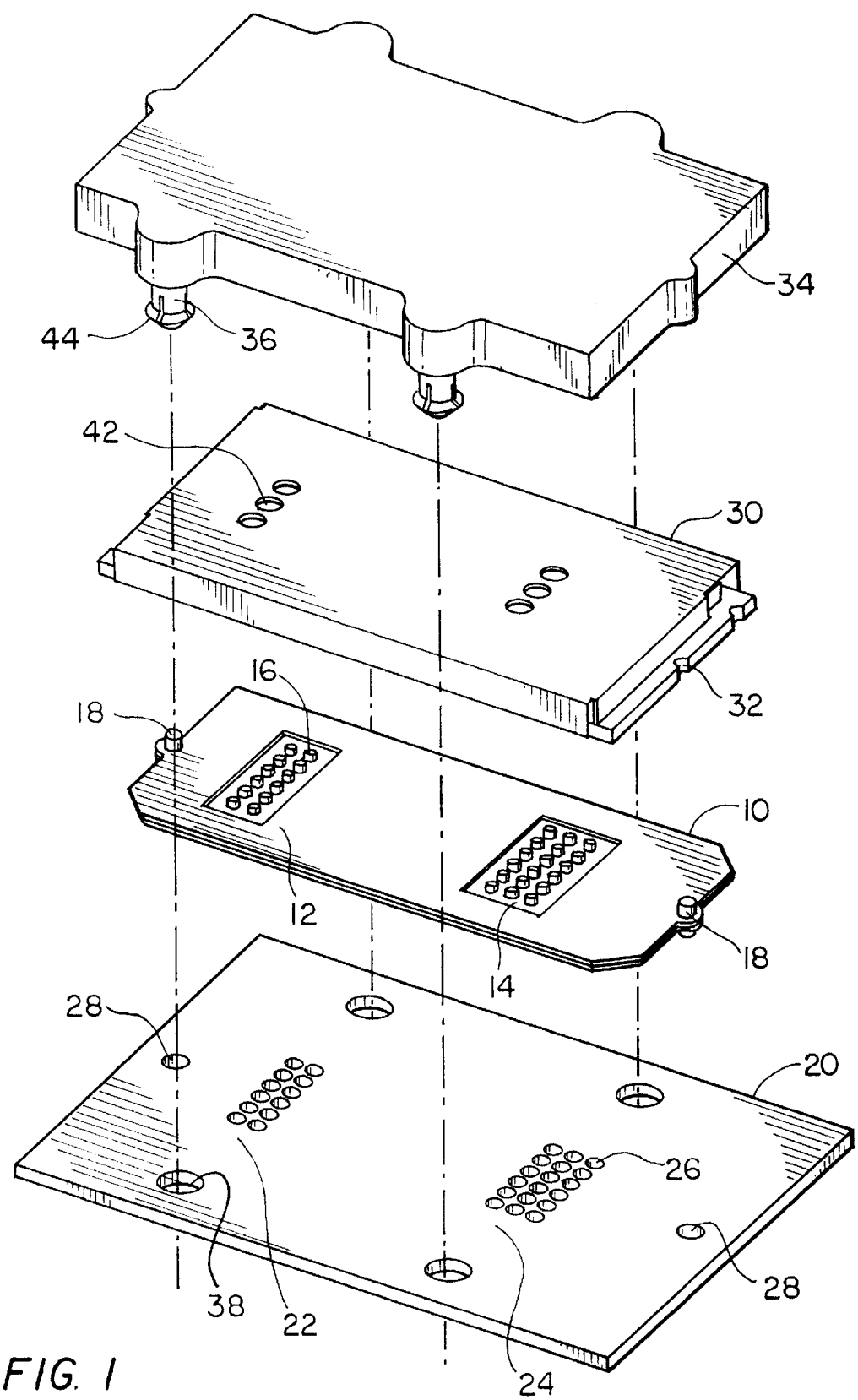
FIG. 1 is an exploded pictorial view of one embodiment of a socket in accordance with the invention.
Figure 2:
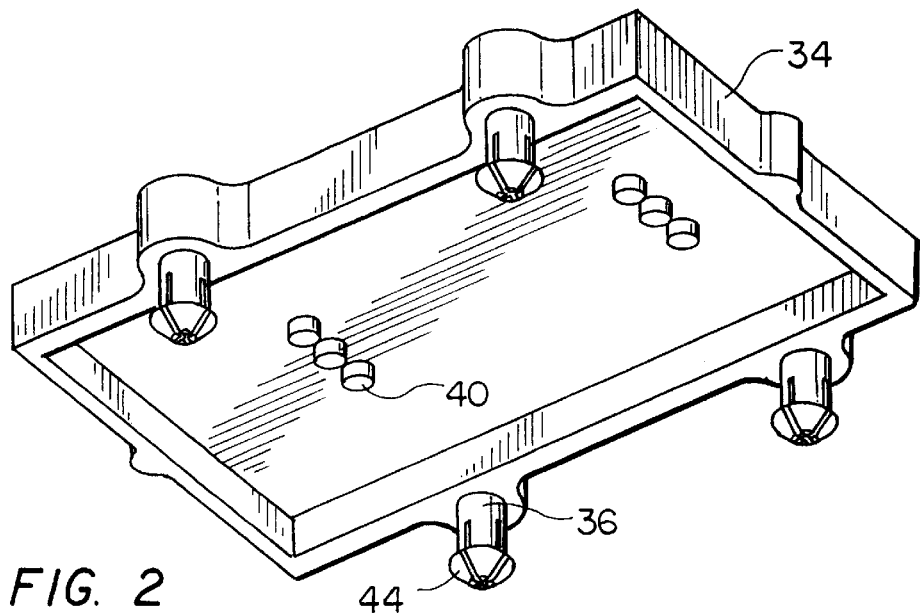
FIG. 2 is a bottom pictorial view of the cover plate of FIG. 1.
Figure 3:
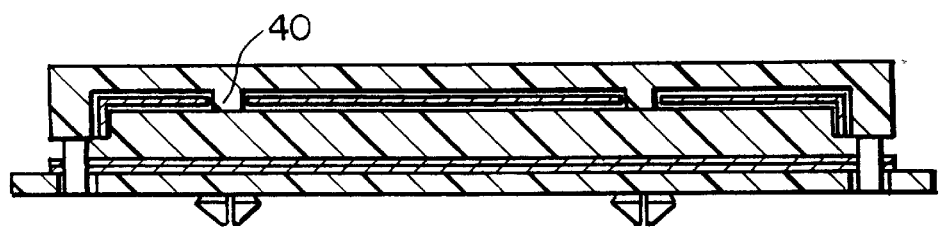
FIG. 3 is a sectional elevation view of the embodiment of FIGS. 1 and 2.

An embodiment of the invention is illustrated in FIGS. 1–3. A socket carrier 10 has a first array 12 and a second array 14 of resilient conductive columns 16 extending between the top surface and bottom surface of the carrier 10. Alignment posts 18 are provided on respective ends of the carrier 10. The carrier 10 is mounted on a printed circuit board 20 having first and second arrays 22 and 24 of contacts 26 arranged in a pattern corresponding to those of column arrays 12 and 14. The alignment posts 18 are cooperative with holes 28 in circuit board 20 to align the carrier 10 on the circuit board for registration of the conductive columns 16 with the contacts 22 to provide electrical connection between the circuit board contacts 26 and conductive columns 16.

An IC package 30 has arrays of contacts 17 and 19 (FIG. 6) on the bottom surface thereof in a pattern corresponding to the pattern of conductive columns 16. The IC package 30 also has alignment slots 32 cooperative with the upwardly extending portions of posts 18 to position the package on the socket carrier so that the conductive columns 16 are in engagement with the contacts on the package 30. A cover carrier 34 fits over the package 30 and has snap fittings 36 depending from the sides of the cover which are cooperative with openings 38 in the circuit board 20 for retaining the cover and package in mounted position on the circuit board with the package electrically connected to the circuit board via the conductive columns 16 of the socket carrier 10.

As shown in FIGS. 2 and 3, the cover 34 has one or more pins 40 outwardly extending from the inner surface of the cover carrier and which are cooperative with recesses 42 (FIG. 1) in the IC package 30 for compression of the IC on the columns.

The snap fittings 36 include a cylindrical body having an enlarged and slotted outer end 44. The enlarged outer end is compressed during insertion into the cooperative circuit board opening 38, and after passage of the enlarged end through the mounting opening, the slotted end returns to its uncompressed position as shown in FIG. 3 to retain the cover on the circuit board and maintain proper compression of the IC on the columns.

Figure 4:
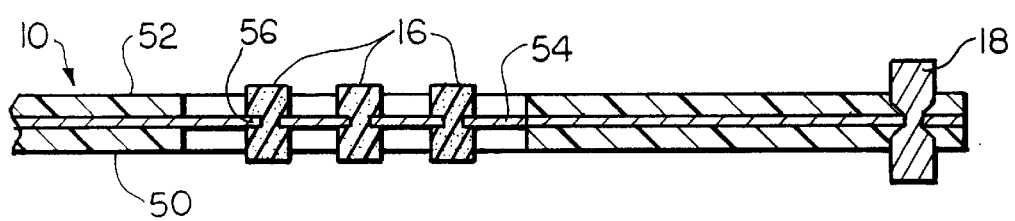
FIG. 4 is an enlarged elevation view of a portion of the socket carrier of the above embodiment.

The socket carrier 10 is shown in greater detail in FIG. 4. The carrier 10 is of multi-layer construction having a frame composed of a bottom layer 50 and a top layer 52, and an intermediate sheet 54 which retains the resilient conductive columns 16 in their predetermined pattern. The columns are retained in the sheet 54 as shown wherein a circumferential groove 56 is provided on each column and which is cooperative with an opening in the sheet 54 to retain the column in a substantially orthogonal disposition in relation to the plane of the sheet. Preferably, the columns are molded to the sheet. The posts 18 are captured on the sheet by a circumferential V groove as shown.

The resilient conductive columns are composed of a polymeric material having conductive particles therein to provide an intended degree of electrical conductivity. Preferably the conductive columns can be as shown in co-pending application Ser. No. 09/222,137 (AUG-C-549GX).

Figure 5:
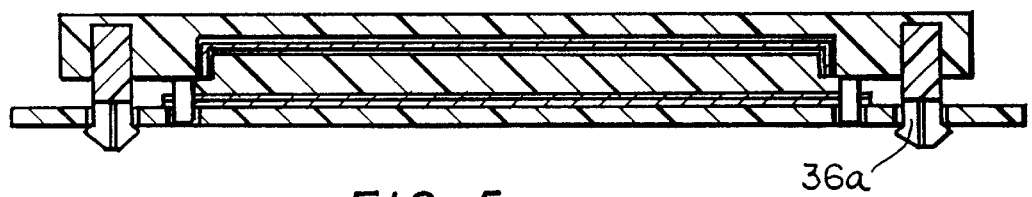
FIG. 5 is a sectional elevation view of an alternative embodiment.

The cover 34 is molded or otherwise fabricated of a suitable non-conductive material such as a plastic. In the above embodiment, the cover 34 has two snap fittings 36 on each side of the cover. The snap fittings can be otherwise disposed to suit particular package configurations. An alternative configuration is shown in FIG. 5 wherein a snap fitting 36a is provided at each shorter side or end of the cover.

Figure 6:
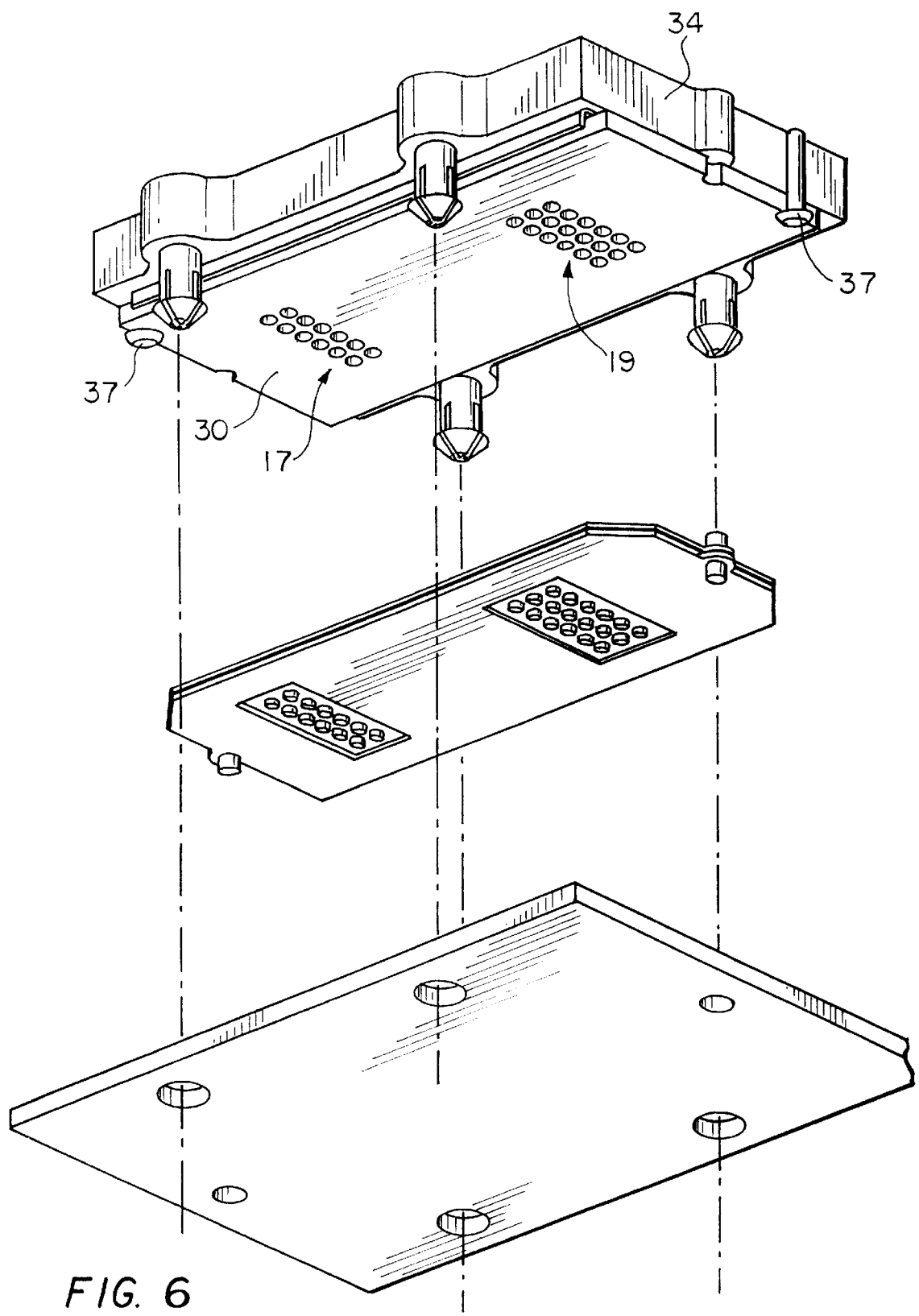
FIG. 6 is an exploded pictorial view of another alternative embodiment.

A further embodiment is shown in FIG. 6 wherein the circuit package 30 is captured or retained on the cover 34 such as by fasteners 37 to be handled as a single unit in installing the circuit package onto a circuit board or removing the package therefrom.

When the cover is seated on the circuit board a compressive force is provided by the conductive column 16 to provide uniform electrical connection with the package contacts and circuit board contacts.

In the illustrated embodiment 30 contact positions are illustrated. An aggregate contact force of about five pounds is provided by the assembled socket. The invention can be implemented in various other embodiments having more or less contact positions to suit particular IC package requirements.

Figure 7:
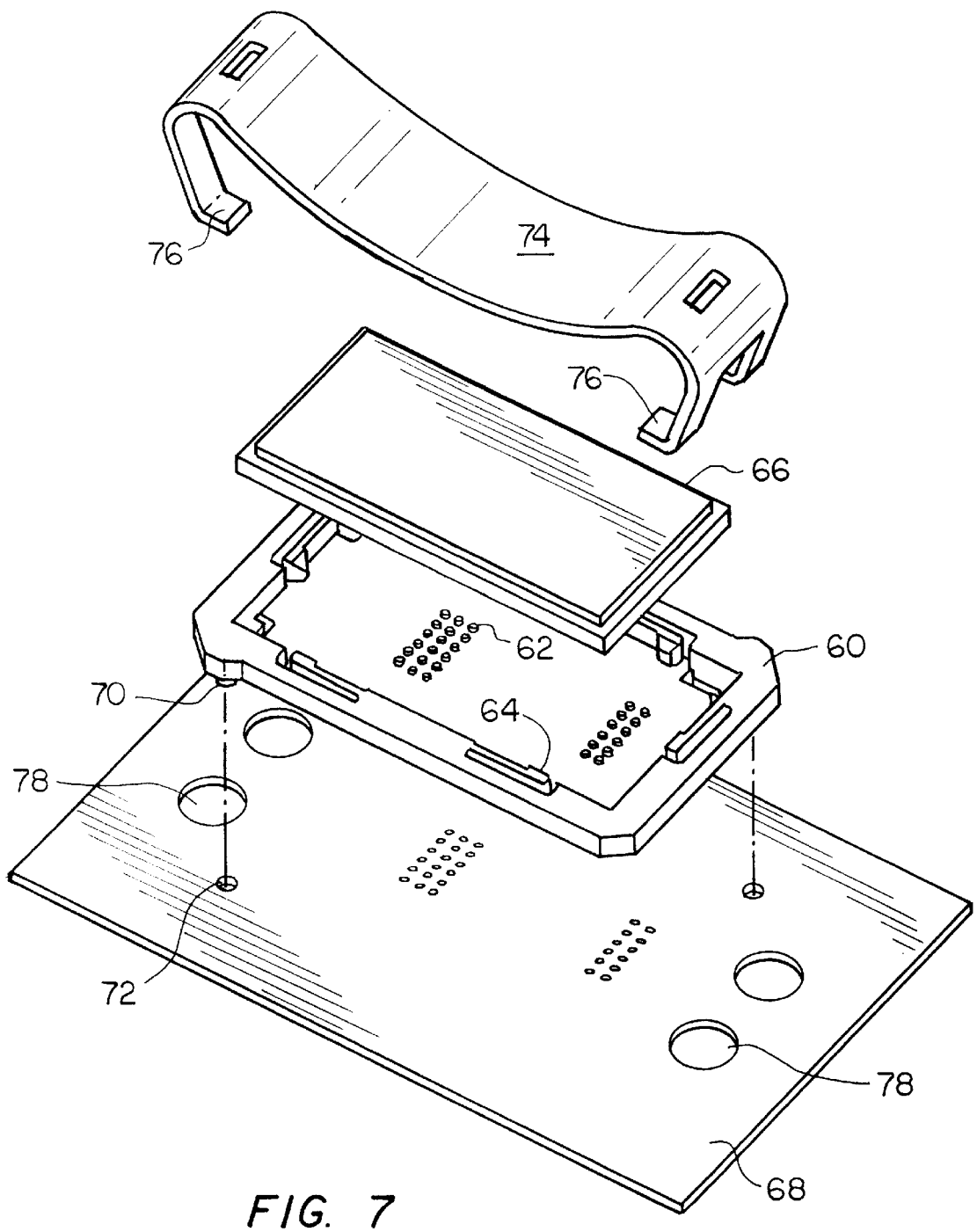
FIG. 7 is an exploded pictorial view of a further embodiment of the invention.
Figure 8:
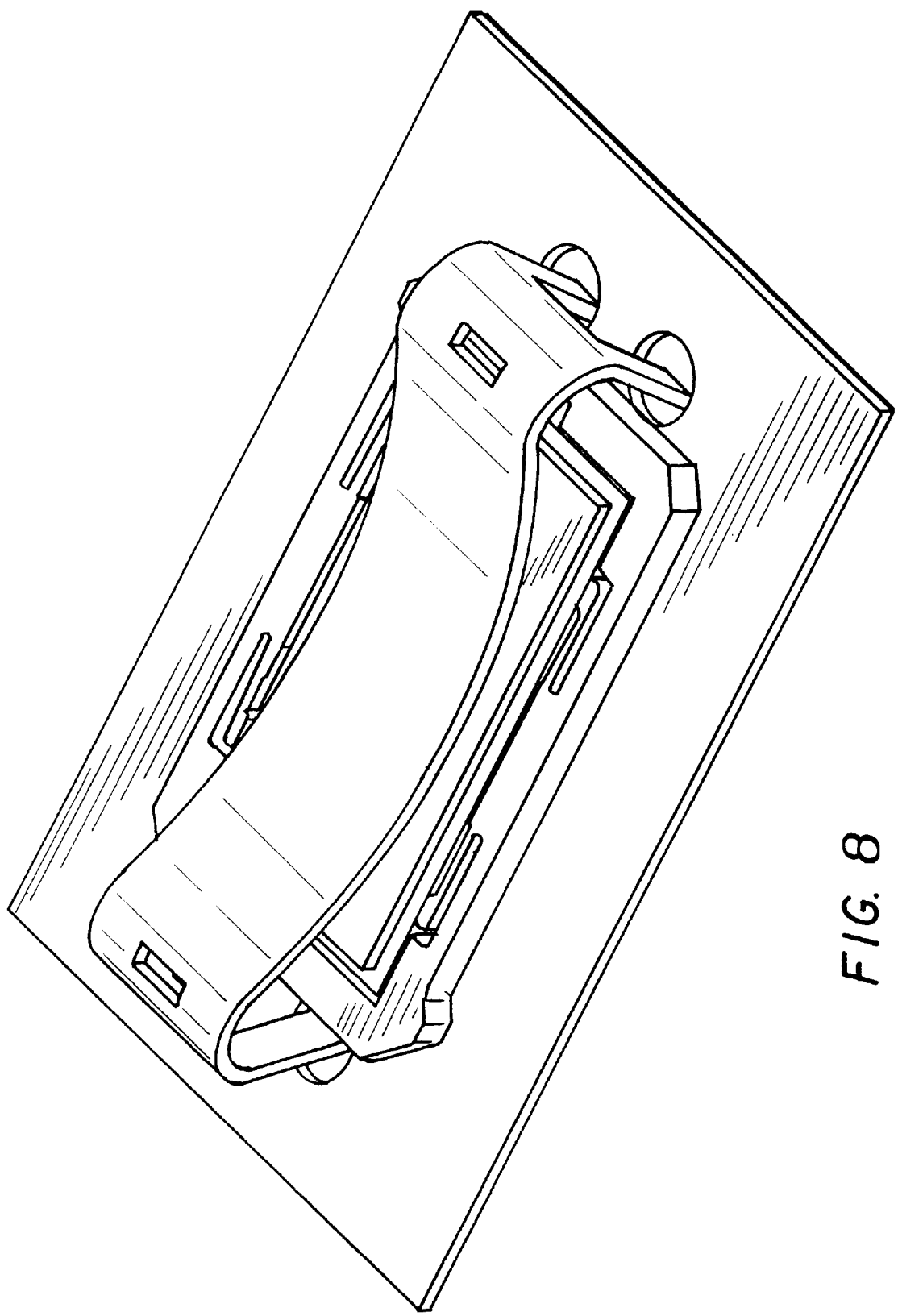
FIG. 8 is a pictorial view of the embodiment of FIG. 7 in assembled position.

A further embodiment is shown in FIGS. 7 and 8. A socket carrier 60 contains an array of resilient conductive columns 62 arranged in predetermined arrays as in the embodiment described above. The frame includes integrally formed spring fingers 64 disposed about the interior periphery thereof. An IC or other circuit package 66 is configured to be disposed within the frame of socket carrier 60 and maintained in proper disposition by the spring fingers 64 such that the conductive columns 62 electrically engage contacts disposed in a conforming pattern on the under surface of the package 66. The socket 60 is aligned or positioned on circuit board 68 by cooperative posts 70 and openings 72. A spring 74 retains the assembly in place by means of spring fingers 76 which are cooperative with openings 78 in the circuit board.

Various other alternative implementations will occur to those versed in the art without departing from the spirit and true scope of the claimed invention.

What is claimed is:

1. A socket for a leadless electronic circuit package comprising:

a socket carrier including a frame retaining a thin electrically insulating sheet;

a plurality of resilient conductive columns mounted on the sheet and extending between top and bottom surfaces thereof;

first alignment elements on the carrier and adapted for cooperation with alignment elements on a circuit board on which the socket carrier is mounted to position the carrier on the circuit board with the conductive columns in registration and electrical contact with corresponding contacts on the circuit board;

the carrier being sized and configured to receive an electronic circuit package having contacts on a surface thereof in a pattern corresponding to the pattern of resilient conductive columns of the socket carrier;

second alignment elements on the carrier adapted for cooperation with alignment elements on the circuit package to provide alignment of the package contacts and the conductive columns when the package is mounted on the socket carrier; and a cover having a plurality of snap fittings which engage cooperative fittings on the circuit board to retain the circuit package in electrical engagement with the circuit board and socket carrier.

2. The socket of claim 1 wherein the socket carrier includes a frame having a top layer of insulating material and a bottom layer of insulating material and between which is retained the thin electrically insulating sheet;

the top and bottom layers of the frame having one or more openings in which the resilient conductive columns are disposed.

3. The socket of claim 1 wherein the frame of the socket carrier includes end portions in which are retained respective first alignment elements.

4. The socket of claim 1 wherein the resilient conductive columns each have a central portion of reduced cross section and which is cooperative with an opening in the thin electrically insulating sheet for retaining the columns on the sheet.

5. The socket of claim 1 wherein the cover has one or more pins outwardly extending from the inner surface of the cover and cooperative with recesses on the electronic circuit package.

6. The socket of claim 1 wherein the snap fittings on the cover are integrally formed therewith.

7. The socket of claim 1 wherein the cover includes one or more fasteners for retaining the electronic circuit package on the cover.

8. The socket of claim 2 wherein the top and bottom layers of the frame of the socket carrier include end portions in which the first alignment elements are retained.

9. A socket for a leadless electronic circuit package comprising:

a socket carrier including a frame retaining a thin electrically insulating sheet;

a plurality of resilient conductive columns mounted on the sheet and extending between top and bottom surfaces thereof;

first alignment elements on the carrier and adapted for cooperation with alignment elements on a circuit board on which the socket carrier is mounted to position the carrier on the circuit board with the conductive columns in registration and electrical contact with corresponding contacts on the circuit board;

the carrier being sized and configured to receive an electronic circuit package having contacts on a surface thereof in a pattern corresponding to the pattern of resilient conductive columns of the socket carrier;

second alignment elements on the carrier adapted for cooperation with alignment elements on the circuit package to provide alignment of the package contacts and the conductive columns when the package is mounted on the socket carrier; and a cover spring cooperative with the circuit board to retain the circuit package in electrical engagement with the circuit board and socket carrier.

10. The socket of claim 9 wherein the second alignment elements on the carrier comprise integrally formed spring fingers disposed about the interior periphery thereof.

11. The socket of claim 9 wherein the cover spring includes spring fingers cooperative with openings in the circuit board to retain the circuit package in electrical engagement with the circuit board and socket carrier.

* * * * *